(12) United States Patent
Tagami et al.

(10) Patent No.: US 6,320,217 B1
(45) Date of Patent: Nov. 20, 2001

(54) SEMICONDUCTOR MEMORY DEVICE

(75) Inventors: Masanori Tagami, Takatsuki; Fumihiko Noro, Kyotanabe, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/256,072

(22) Filed: Feb. 24, 1999

(30) Foreign Application Priority Data

Jun. 10, 1998 (JP) ................................. 10-162054

(51) Int. Cl.[7] .................................................. H01L 29/788
(52) U.S. Cl. .......................... 257/315; 257/296; 257/300; 257/316; 257/321; 257/326; 257/389; 257/395; 257/501; 257/504; 257/506
(58) Field of Search ..................................... 257/315, 316, 257/321, 326, 389, 395, 296, 300, 501, 504, 506

(56) References Cited

U.S. PATENT DOCUMENTS 4,675,982 * 6/1987 Noble, Jr. et al. .................. 29/576 B
5,324,972 * 6/1994 Takebuchi et al. .................. 257/318
5,942,780 * 8/1999 Barsan et al. ......................... 257/321

FOREIGN PATENT DOCUMENTS 1-225364    9/1989 (JP) .

* cited by examiner

Primary Examiner—Eddie Lee
Assistant Examiner—Matthew E. Warren
(74) Attorney, Agent, or Firm—Stevens, Davis, Miller & Mosher, LLP

(57) ABSTRACT

Conventionally, an insulating film for element isolation has had a uniformly large thickness either in a memory cell area and in a peripheral circuit area so that the total film thickness of the memory cell area having a floating gate electrode, a control gate electrode, and an erase gate electrode is extremely increased, resulting in a large height difference between the memory cell area and the peripheral circuit area. The insulating film for element isolation in the peripheral circuit area should be thick, while the insulating films for element isolation in the memory cell area need not be as thick as the insulating film for element isolation in the peripheral circuit area in terms of operation. Therefore, the total film thickness of the memory cell area as well as the height difference between the memory cell area and the peripheral circuit area can be reduced by forming the insulating films for element isolation in the memory cell area which are thinner than the insulating film for element isolation in the peripheral circuit area.

2 Claims, 23 Drawing Sheets

US 6,320,217 B1

SEMICONDUCTOR MEMORY DEVICE

BACKGROUND OF THE INVENTION

1. Field of the Invention

The present invention relates to a semiconductor memory device such as a flash EEPROM (Electrically Erasable and Programmable Read Only Memory) having a floating gate electrode, a control gate electrode, and an erase gate electrode and to a manufacturing method therefor.

2. Prior Art

As an electrically writable non-volatile memory, a flash EEPROM has been well known. The flash EEPROM has such a structure that a floating gate electrode is formed via a gate insulating film on a channel region interposed between source and drain regions formed in a semiconductor substrate and a control gate electrode is further formed via a gate insulating film on the floating gate electrode. A write operation to the flash EEPROM is performed by generating hot electrons in the channel region adjacent to the drain of the semiconductor substrate with the application of a high voltage to the drain region and to the control gate electrode and injecting the hot electrons under acceleration into the floating gate electrode. To perform an erase operation to the flash EEPROM, there has recently been adopted a method in which the floating gate electrode is caused to emit electrons to the source or drain region or to the channel region via the gate insulating film by using a tunneling phenomena or a method using an erase gate electrode formed on the floating gate electrode via tunneling insulating films, in which electrons are caused to tunnel from the floating gate electrode to the erase gate electrode with the application of an erase voltage to the erase gate electrode.

As extreme miniaturization, higher integration, and higher performance has been required of semiconductor memory devices in recent years, extreme miniaturization and higher performance has also been required more urgently of the foregoing electrically erasable flash EEPROM. In particular, a reduction in the film thickness of a memory cell and a reduction in the height difference between a MOS transistor composing a peripheral circuit (hereinafter referred to as a "peripheral transistor") and the memory cell have been in growing demand to achieve extreme miniaturization.

As a method of reducing the height difference between the peripheral transistor and the memory cell, there has conventionally been known one using a step-height reducing mask. In accordance with the method, the height difference between the peripheral transistor and the memory cell can be reduced by using the step-height reducing mask which is formed with an aperture corresponding to a portion having a large step height, such as the memory cell, compared with the semiconductor substrate and the peripheral portion.

Referring to FIGS. 15 to 23, a flash EEPROM as a conventional semiconductor memory device will be described.

FIG. 15 is a plan view of a memory cell area in the conventional semiconductor memory device. FIG. 16 is a cross-sectional view taken along the line III–III' of FIG. 15. FIG. 17 is a cross-sectional view taken along the line IV–IV' of FIG. 15.

As shown in FIGS. 15 to 17, the conventional semiconductor memory device comprises: source/drain regions 1 of a memory cell formed in a specified region of a semiconductor substrate 2; an insulating film 5 for element isolation; first and second insulating films 6 and 8 each forming a gate insulating film; a floating gate electrode 7; a control gate electrode 9; a first interlayer insulating film 12 composed of a third insulating film 10 and sidewall insulating films 11; tunneling insulating films 13; and an erase gate electrode 15.

A description will be given to a method of manufacturing the conventional semiconductor memory device thus constituted with reference to FIGS. 18 to 23, which are cross-sectional views illustrating process steps in accordance with the manufacturing method. It is to be noted that the memory cell area in FIGS. 18 to 23 shows a cross-sectional portion taken along the line IV–IV' of FIG. 15.

First, as shown in FIG. 18, the source/drain regions 1 (see FIGS. 15 and 16) are formed in specified regions of the memory cell area in a main surface of the semiconductor substrate 2. After the insulating film 3 is formed over the main surface of the semiconductor substrate 2, a mask pattern 4 is formed from a photoresist by using a lithographic technique.

Next, as shown in FIG. 19, the insulating film 5 for element isolation is formed by anisotropic etching and then the mask pattern 4 formed of the photoresist is removed.

Next, as shown in FIG. 20, a first insulating film 6 is formed by a thermal oxidation process and then a first polysilicon film is deposited by a CVD process. The first polysilicon film is masked and formed into stripes elongated along the cross section taken along the line IV–IV' (FIG. 15) by etching. Subsequently, the second insulating film 8 is formed by a thermal oxidation process and then a second polysilicon film and an insulating film are deposited by a CVD process. The resulting structure is masked and subjected to anisotropic etching to form the third insulating film 10 and the control gate electrode 9. Thereafter, the sidewall insulating films 11 are formed by using a known technique. Hereinafter, the combination of the third insulating film 10 and the sidewall insulating films 11 will be termed the first interlayer insulating film 12. Then, the first polysilicon film is etched by an anisotropic etching technique using the first interlayer insulating film 12 as a mask to form the floating gate electrode 7. In FIG. 20, the memory cell area in which memory cells are to be formed is designated at A, while a peripheral circuit area in which a peripheral circuit is to be formed is designated at B.

Next, as shown in FIG. 21, the tunneling insulating films 13 and the gate insulating film 14 of a peripheral transistor are formed by a thermal oxidation process, followed by a third polysilicon film deposited thereon by a CVD process. The third polysilicon is then masked and subjected to anisotropic etching, thereby forming the erase gate electrode 15 in the memory cell area A and the gate electrode 16 of the peripheral transistor in the peripheral circuit area B. Subsequently, arsenic is implanted into the peripheral circuit area B by using a mask formed with an aperture corresponding to the specified source/drain regions of the peripheral transistor, thereby forming the source/drain regions 17 of the peripheral transistor and completing the formation of the memory cell and the peripheral transistor.

Next, as shown in FIG. 22, a second interlayer insulating film 18 is deposited by the process of atmospheric pressure CVD and subjected to anisotropic etching after a photoresist 19 is formed by using a step-height reducing mask formed with an aperture corresponding to a portion with a large step height, such as the memory cell. Subsequently, the photoresist 19 is removed and annealing treatment is performed to form a planarized interlayer insulating film 20, as shown in FIG. 23. Thus, in the conventional manufacturing method, the stepped underlie is planarized to facilitate patterning in the subsequent wiring step and the interlayer insulating film is planarized by using the step-height reducing mask after the formation of the memory cell.

According to the conventional structure and manufacturing method, the insulating film 5 for element isolation has a uniform thickness since it is formed simultaneously for use in the memory cell area and in the peripheral circuit area. On the other hand, the total film thickness $a_2$ of the memory cell is three times the total thickness $b_2$ of the peripheral transistor or more since, in the memory cell area A, the floating gate electrode 7 is formed continuously over the first insulating film 6 and the end portions of the insulating films 5 for element isolation located on both sides thereof and the control gate electrode 9 and the erase gate electrode 15 are formed on the floating gate electrode 7, as shown in FIG. 21. Moreover, the total film thickness of the floating gate electrode 7, the control gate electrode 9, and the erase gate electrode 15 is dependent on the step height of the underlying layer since, to perform precise pattern formation for these electrodes, it is required to deposit a polysilicon film to such a thickness as to eliminate the height difference in the underlying layer prior to etching. As the step height of the underlying layer is larger, the film thickness should be larger. As the step height of the underlying layer is larger, the formation of the pattern on the underlying layer becomes more difficult.

For example, the difference ($a_2$–$b_2$) between the total film thickness $a_2$ of the memory cell and the total film thickness $b_2$ of the peripheral transistor is increased in the wiring step subsequent to the formation of the memory cell and the peripheral transistor as shown in FIG. 21, resulting in an increased height difference between the memory cell area A and the peripheral circuit area B. Unless planarization is performed by using the step-height reducing mask after the deposition of the second interlayer insulating film 18 as shown in FIG. 22, a sufficient margin is no more allowed for focal depth during wire patterning, which renders the formation of a wiring pattern difficult. Hence, the stepped underlie should be planarized by using the step-height reducing mask.

SUMMARY OF THE INVENTION

It is therefore an object of the present invention to provide a semiconductor memory device and a manufacturing method therefor which enable the reduction of a height difference between the memory cell area and the peripheral circuit area.

The semiconductor memory device according to the present invention is a semiconductor memory device having a memory cell area and a peripheral circuit area each provided in a semiconductor substrate, the device comprising: source and drain regions formed in specified regions of the semiconductor substrate located in the memory cell area; an insulating film for element isolation in the peripheral circuit area formed on a specified region of the semiconductor substrate located in the peripheral circuit area; a pair of insulating films for element isolation in the memory cell area formed on specified regions of the semiconductor substrate located in the memory cell area, each of the pair of insulating films for element isolation in the memory cell area having a thickness smaller than that of the insulating film for element isolation in the peripheral circuit area; a gate insulating film formed on a portion of the semiconductor substrate isolated by the pair of insulating films for element isolation in the memory cell area; a floating gate electrode formed in contact with an end portion of at least one of the pair of insulating films for element isolation in the memory cell area in a specified region located between the source and drain regions and over the gate insulating film; a control gate electrode formed above said floating gate electrode; and an erase gate electrode formed on the one of the insulating films for element isolation in the memory cell area in contact with the floating gate electrode, the erase gate electrode being in contact with a sidewall of the floating gate electrode via a tunneling insulating film and with the control gate electrode via an interlayer insulating film.

The method of manufacturing the semiconductor memory device according to the present invention is a method of manufacturing a semiconductor memory device having a memory cell area and a peripheral circuit area provided in a semiconductor substrate, the method comprising: a step of forming source and drain regions in specified regions of the semiconductor substrate located in the memory cell area; an element-insolation-insulating-film formation step for forming an insulating film for element isolation in the peripheral circuit area on a specified region of the semiconductor substrate located in the peripheral circuit area and forming a pair of insulating films for element isolation in the memory cell area on specified regions of the semiconductor substrate located in the memory cell area, each of the pair of insulating films for element isolation in the memory cell area having a thickness smaller than that of the insulating film for element isolation in the peripheral circuit area; and a step of forming a principal portion of the memory cell area composed of a gate insulating film provided on a portion of the semiconductor substrate isolated by the pair of insulating films for element isolation in the memory cell area, a floating gate electrode provided in contact with an end portion of at least one of the pair of insulating films for element isolation in the memory cell area in a specified region located between the source and drain regions and over the gate insulating film, a control gate electrode provided above the floating gate electrode, an interlayer insulating film covering a surface of the control gate electrode, a tunneling insulating film provided on a sidewall of the floating gate electrode, and an erase gate electrode provided on the one of the insulating films for element isolation in the memory cell area in contact with the sidewall of the floating gate electrode via the tunneling insulating film and with the control gate electrode via the interlayer insulating film.

According to the present invention, it becomes possible to reduce the total film thickness of the memory cell area as well as a height difference between the memory cell area and the peripheral circuit area by forming the insulating films for element isolation in the memory cell area which are thinner than the insulating film for element isolation in the peripheral circuit area. It is also possible to reduce the film thickness of the floating gate electrode, control gate electrode, and erase gate electrode in the memory cell area by forming the insulating films for element isolation in the memory cell area which are thinner than the insulating film for element isolation in the peripheral circuit area, thereby further reducing the total film thickness of the memory cell area as well as the height difference between the memory cell area and the peripheral circuit area. By thus reducing the height difference between the memory cell area and the peripheral circuit area, the step height of the underlie can be reduced without using a step-height reducing mask in the subsequent wiring step.

The insulating film for element isolation in the peripheral circuit area and the insulating films for element isolation in the memory cell area can easily be formed by forming an insulating film on the semiconductor substrate in the peripheral circuit area and the memory cell area, etching a portion of the insulating film located in the memory cell area to reduce the thickness thereof, and etching the insulating film in the peripheral circuit area and the memory cell area into a desired pattern or, alternatively, by forming an insulating film on the semiconductor substrate in the peripheral circuit area and the memory cell area, etching the insulating film into a desired pattern, and etching a portion of the insulating film located in the memory cell area to reduce the thickness thereof. The method allows easy formation of the insulating films for element isolation in the memory cell area which are thinner than the insulating film for element isolation in the peripheral circuit area.

DETAILED DESCRIPTION OF PREFERRED EMBODIMENTS

Figure 1:
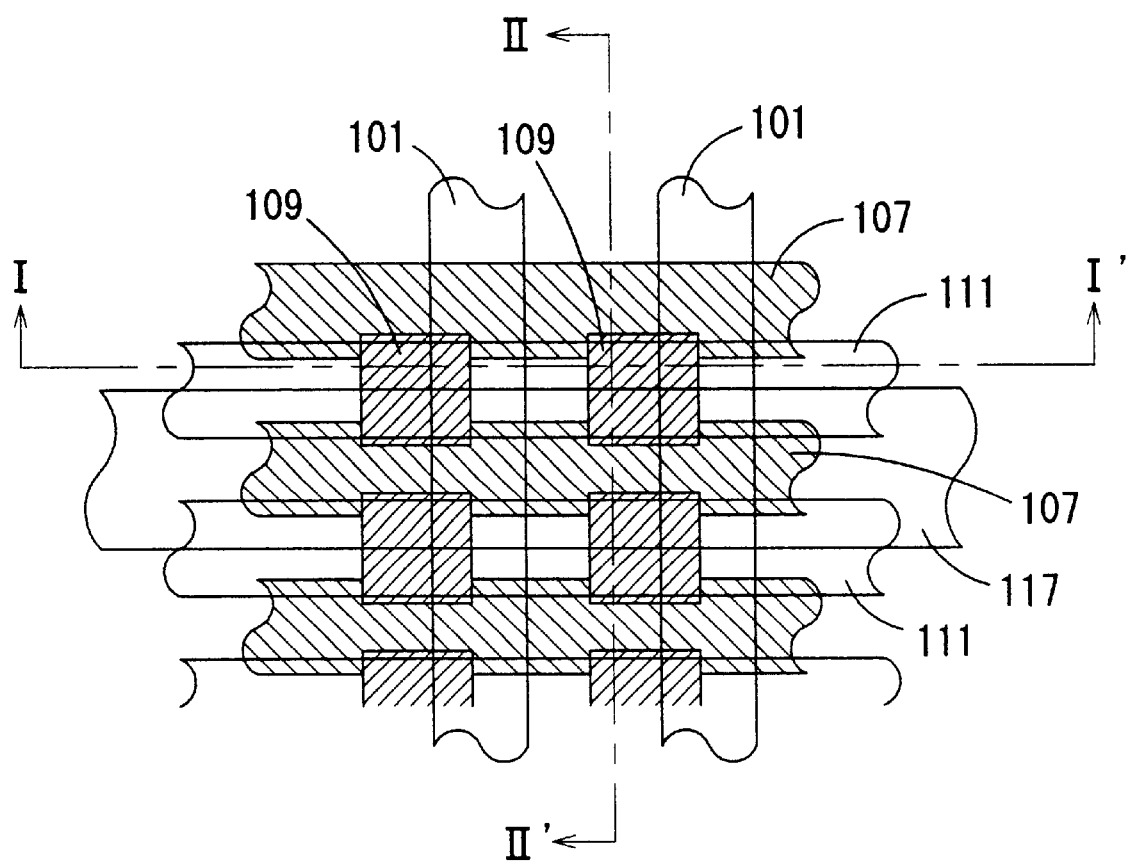
FIG. 1 is a plan view of a memory cell area in a semiconductor memory device according to an embodiment of the present invention.

Since an erase operation to a flash EEPROM requires an intense electric field, an insulating film for element isolation in a peripheral circuit area generally needs a sufficient thickness to retain voltage resistance as a field isolation that can provide electric isolation between adjacent elements. By contrast, insulating films for element isolation in a memory cell area need not provide electric isolation between adjacent memory cells since an erase operation to the flash EEPROM is a simultaneous erase operation performed at one time with respect to a plurality of memory cells. Hence, it is sufficient for each of the insulating films for element isolation in the memory cell area to have such a thickness as to prevent a breakdown in the oxide film in the intense field during the erase operation. Therefore, each of the insulating films for element isolation in the memory cell area may have a thickness extremely smaller than the thickness of the insulating film element isolation in the peripheral circuit area.

Referring to the drawings, the embodiments of the present invention will be described.

Figure 2:
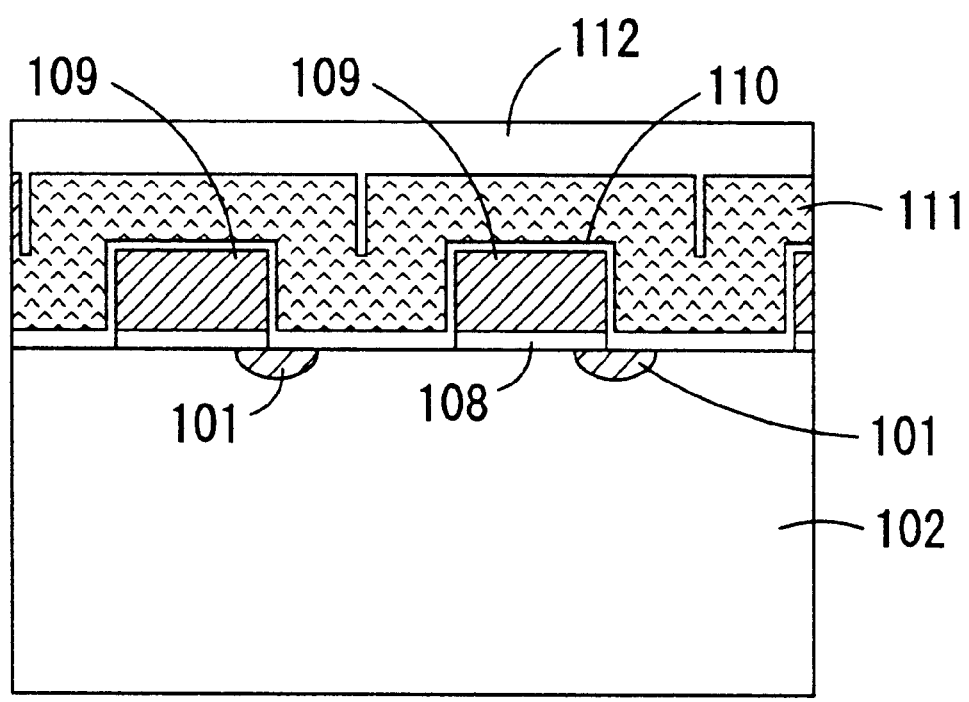
FIG. 2 is a cross-sectional view taken along the line I–I' of FIG. 1.
Figure 3:
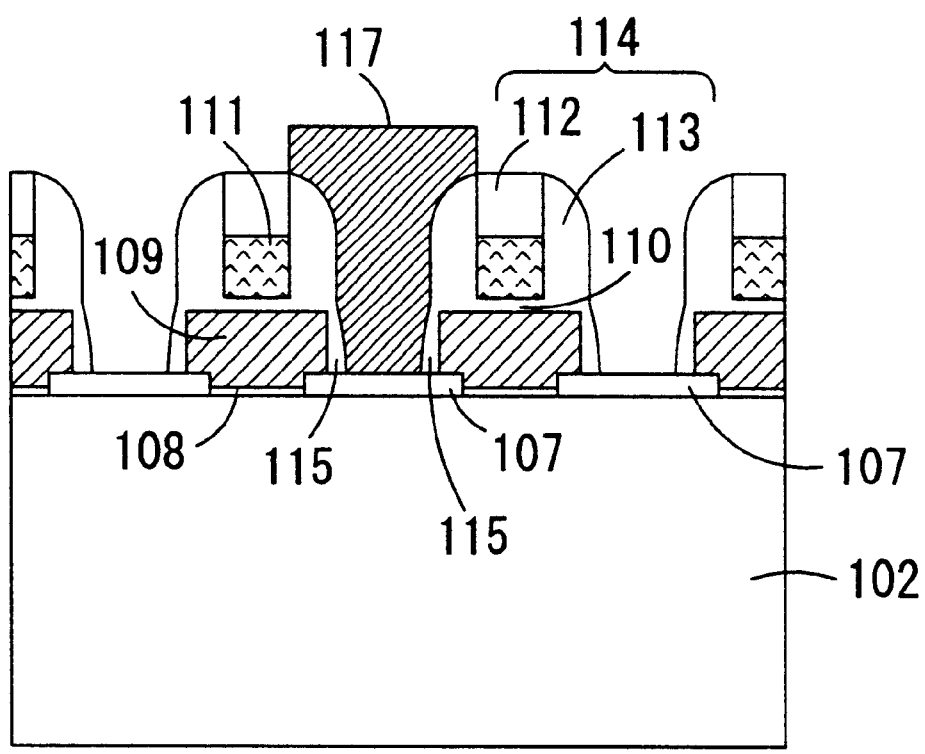
FIG. 3 is a cross-sectional view taken along the line II–II' of FIG. 1.
Figure 4:
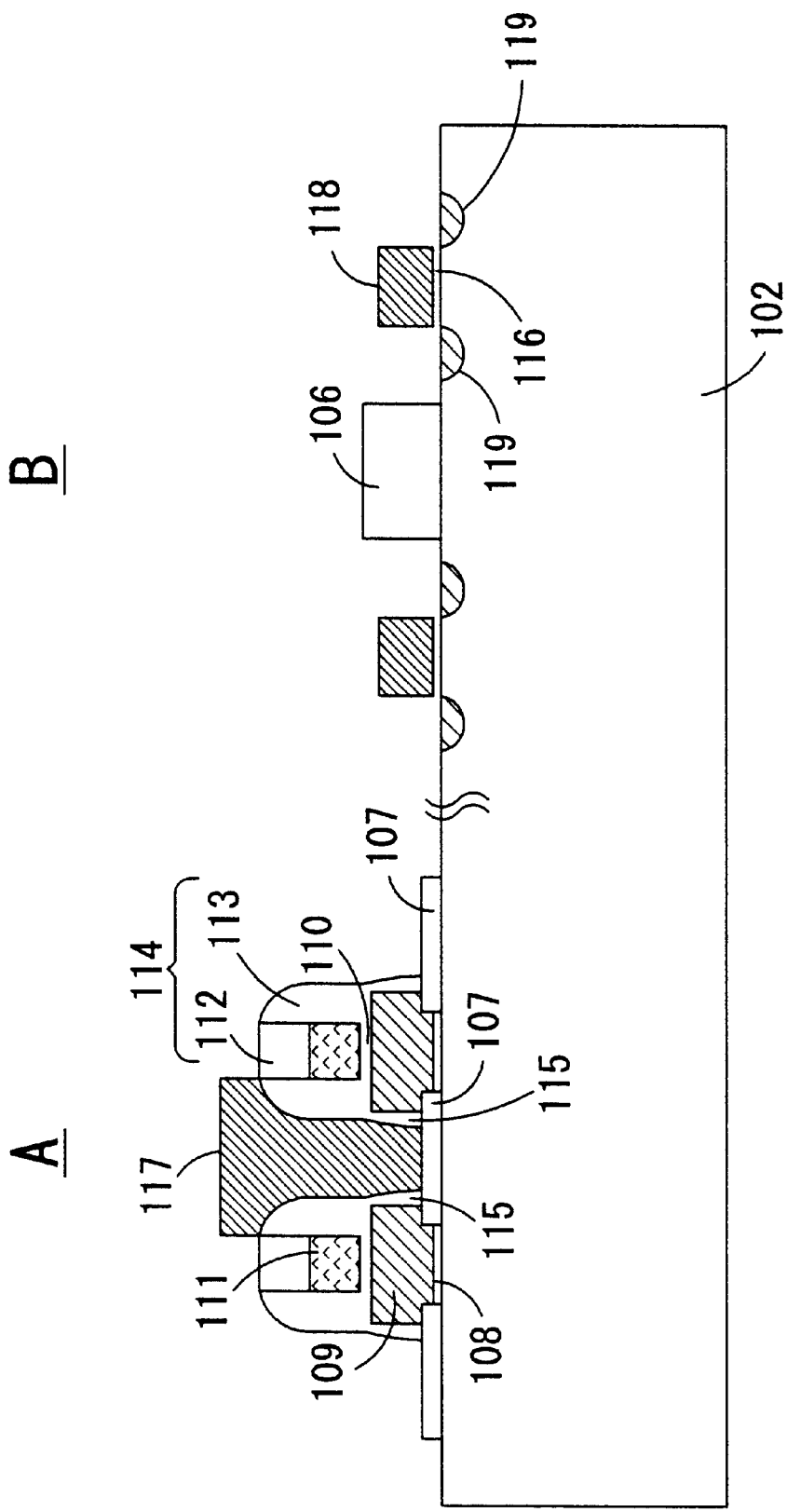
FIG. 4 is a cross-sectional view showing a structure of the semiconductor memory device according to the embodiment of the present invention.

FIG. 1 is a plan view of the memory cell area of a semiconductor memory device according to an embodiment of the present invention. FIG. 2 is a cross-sectional view taken along the line I–I' of FIG. 1. FIG. 3 is a cross-sectional view taken along the line II–II' of FIG. 1. FIG. 4 is a cross-sectional view of the semiconductor memory device according to the embodiment of the present invention. In FIG. 4, the memory cell area in which memory cells are to be formed and the peripheral circuit area in which a peripheral circuit is to be formed are designated at A and B, respectively. The memory cell area A in FIG. 4 shows the cross-sectional portion taken along the line II–II' of FIG. 1.

As shown in FIGS. 1 to 3, the memory cell area A of the semiconductor memory device according to the present embodiment has a memory cell structure comprising: source/drain regions 101 of the memory cell formed in specified regions of a semiconductor substrate 102; insulating films 107 for element isolation in the memory cell area; first and second insulating films 108 and 110 each forming a gate insulating film; a floating gate electrode 109; a control gate electrode 111; a first interlayer insulating film 114 composed of a third insulating film 112 and sidewall insulating films 113; tunneling insulating films 115; and an erase gate electrode 117. The floating gate electrode 109 is formed in a specified region located between the source/drain regions 101 and over the first insulating film 108 formed on the semiconductor substrate 102 isolated by a pair of insulating films 107 for element isolation in the memory cell area. The control gate electrode 111 is formed above the floating gate electrode 109 via the second insulating film 110. The erase gate electrode 117 is formed over one of the pair of insulating films 107 for element isolation in the memory cell area to be in contact with a sidewall of the floating gate electrode 109 via the tunneling insulating films 115 and with the control gate electrode 111 via the first interlayer insulating film 114. Although the floating gate electrode 109 is formed to extend from an end portion of one of the pair of insulating films for element isolation in the memory cell area to an end portion of the other insulating film for element isolation in the memory cell area, the floating gate electrode 109 need not necessarily be in contact with the other insulating film for element isolation in the memory cell area on which the erase gate electrode 117 is not formed provided that it is in contact with one of the insulating films for element isolation in the memory cell area on which the erase gate electrode 117 is formed.

As shown in FIG. 4, the peripheral circuit area B is provided with: an insulating film 106 for element isolation in the peripheral circuit area; a gate insulating film 116 of a peripheral MOS transistor; a gate electrode 118 of the peripheral MOS transistor; and source/drain regions 119 of the peripheral MOS transistor.

The semiconductor memory device according to the present embodiment is primarily characterized in that the insulating films 107 for element isolation in the memory cell area are formed thinner than the insulating film 106 for element isolation in the peripheral circuit area. The structure presents no operational problem since, in contrast to the insulating film 106 for element isolation in the peripheral circuit area which needs a sufficient thickness to retain voltage resistance as a field isolation, as stated previously, it is sufficient for each of the insulating films 107 for element isolation in the memory cell area to have such a thickness as to prevent a breakdown in the oxide film owing to an erase operation to the flash EEPROM which is a simultaneous erase operation performed at one time with respect to a plurality of memory cells.

Next, a method of manufacturing the semiconductor memory device according to the embodiment of the present invention will be described with reference to FIGS. 5 to 14, which are cross-sectional views illustrating process steps. In FIGS. 5 through 14, the memory cell area A shows the cross-sectional portion taken along the line II–II' of FIG. 1.

Figure 5:
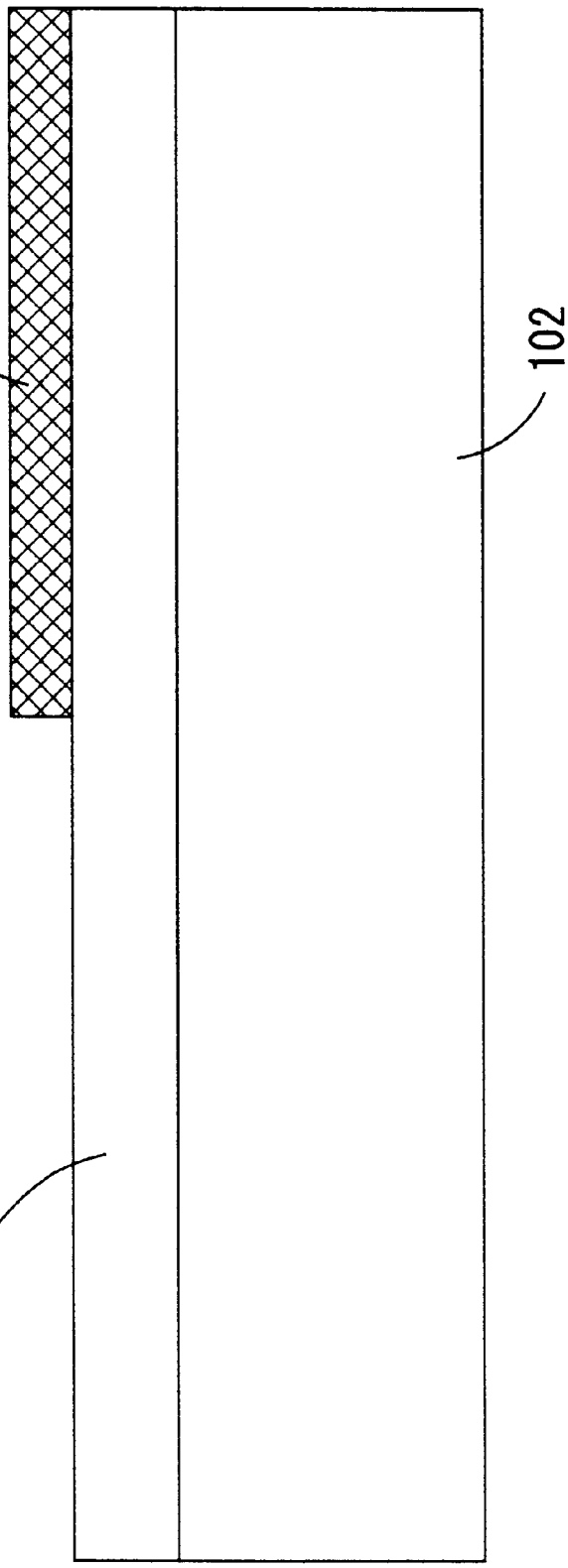
FIG. 5 is a cross-sectional view illustrating a process step in accordance with a method of manufacturing the semiconductor memory device according to the present invention.

First, as shown in FIG. 5, the source/drain regions 101 (see FIGS. 1 and 2) are formed in the specified regions of the memory cell area A in a main surface of the semiconductor substrate 102. After the insulating film 103 with a thickness of about 500 nm is formed by a CVD process on the main surface of the semiconductor substrate 102, a mask pattern 104 with an aperture corresponding only to the memory cell area A is formed from a photoresist by using a lithographic technique.

Figure 6:
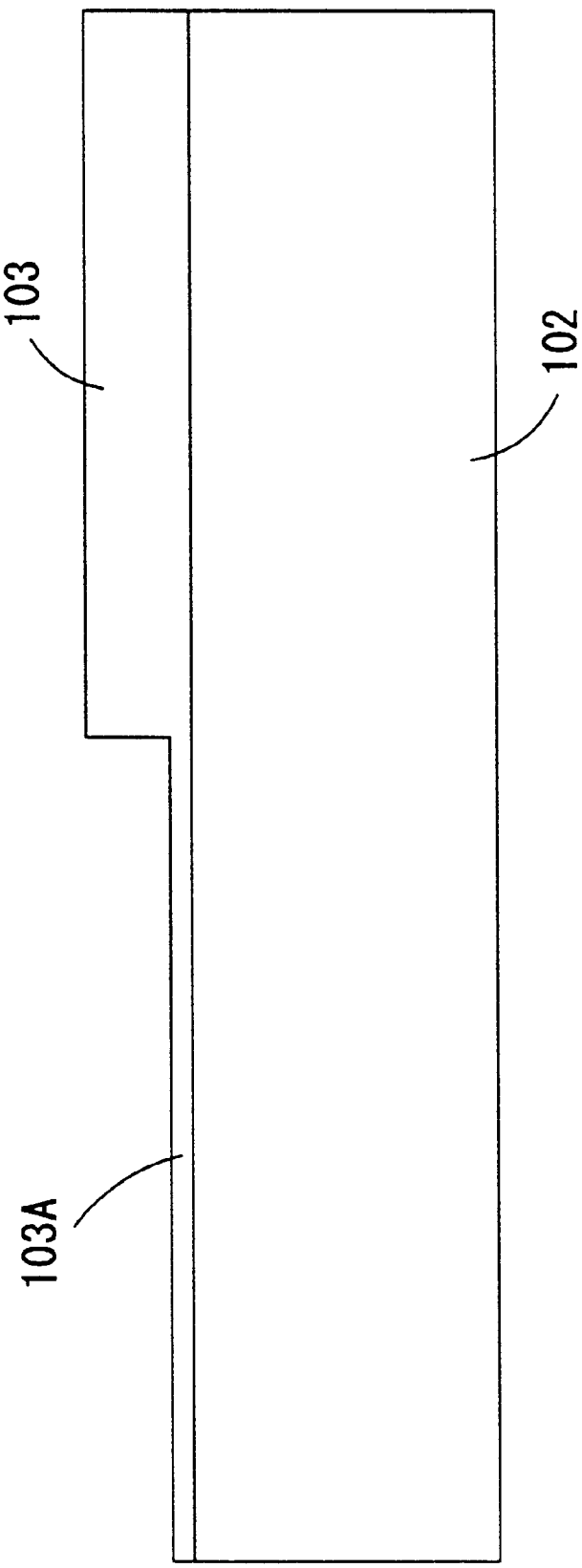
FIG. 6 is a cross-sectional view illustrating a process step in accordance with the method of manufacturing the semiconductor memory device according to the present invention.

Next, as shown in FIG. 6, the insulating film 103 overlying the memory cell area A is etched by a thickness of about 400 nm by using an anisotropic dry-etching technique to form a thin insulating film 103A. Thereafter, the mask pattern 104 formed of the photoresist is removed.

Figure 7:
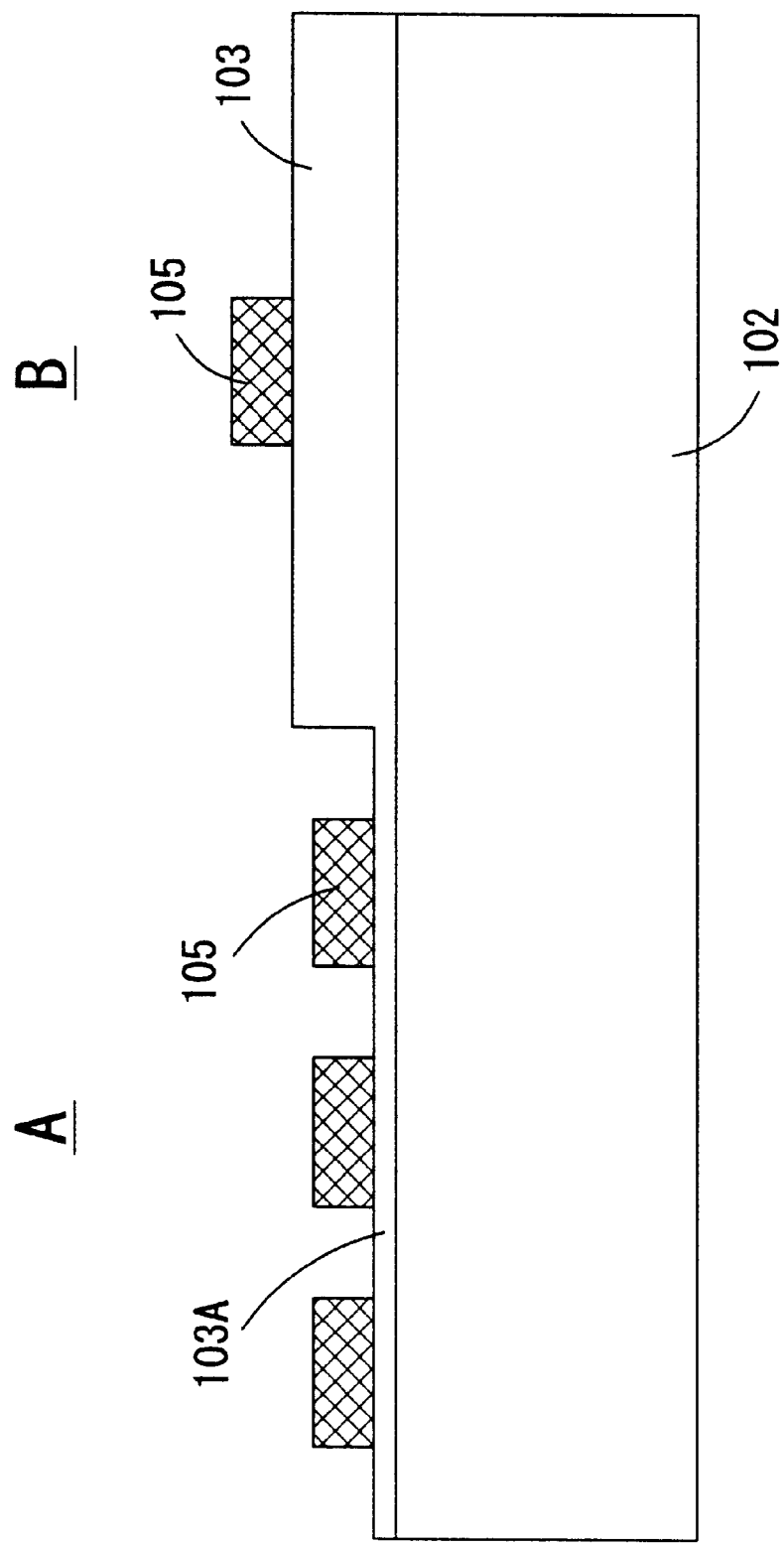
FIG. 7 is a cross-sectional view illustrating a process step in accordance with the method of manufacturing the semiconductor memory device according to the present invention.

Next, as shown in FIG. 7, a mask pattern 105 for forming the insulating films for element isolation is formed from a photoresist by using a lithographic technique.

Figure 8:
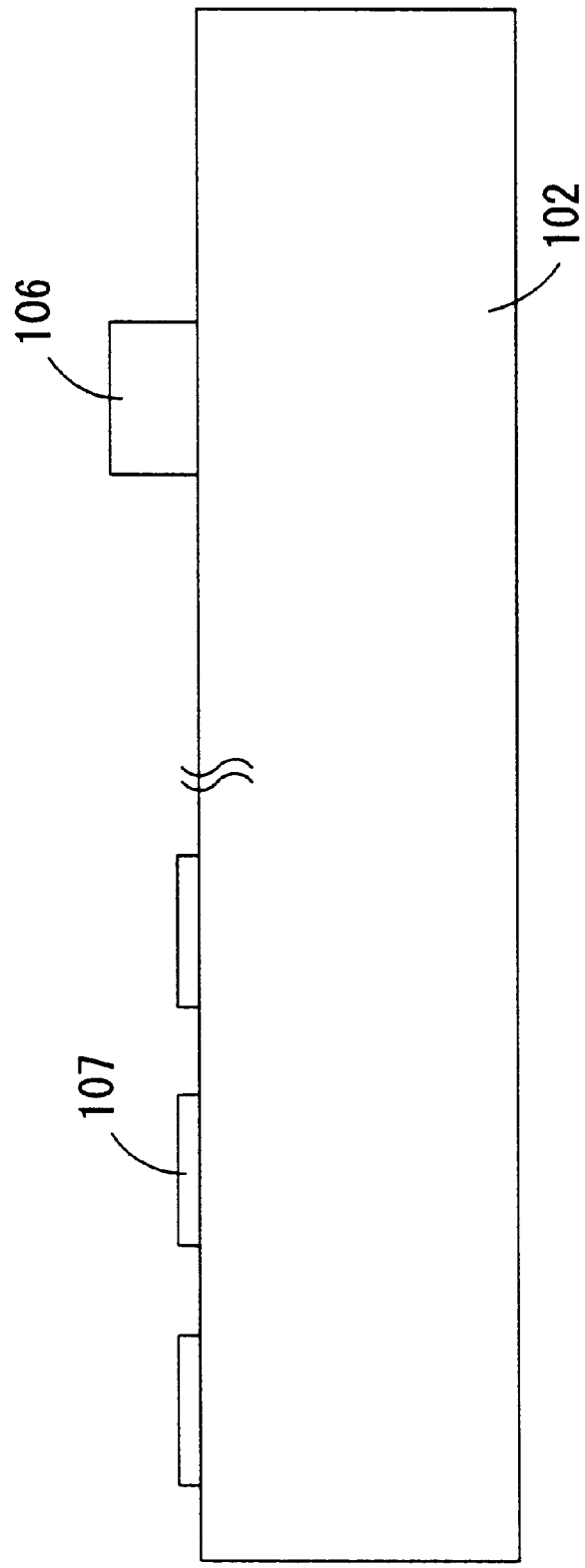
FIG. 8 is a cross-sectional view illustrating a process step in accordance with the method of manufacturing the semiconductor memory device according to the present invention.

Next, as shown in FIG. 8, each of the insulating film 103 and the thin insulating film 103A is etched by a thickness of about 500 nm by using an anisotropic dry-etching technique to form the insulating film 106 for element isolation in the peripheral circuit area and the insulating films 107 for element isolation in the memory cell area. Thereafter, the mask pattern 105 formed of the photoresist is removed.

Figure 9:
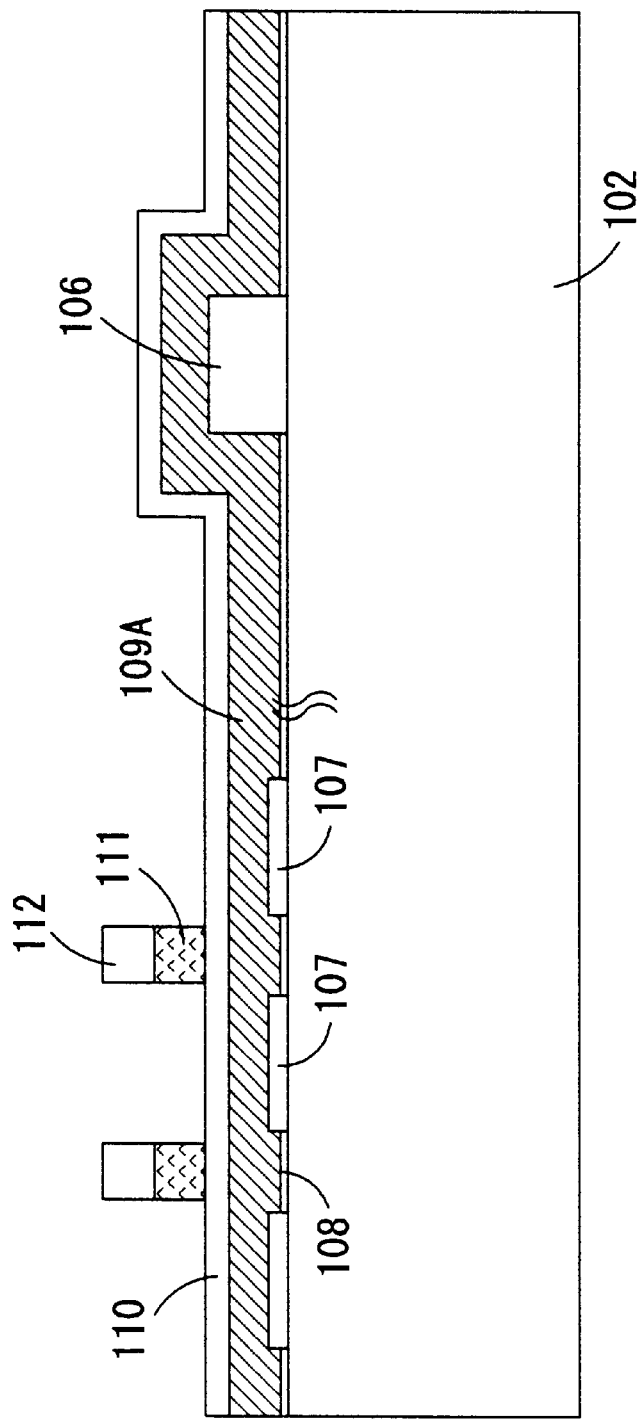
FIG. 9 is a cross-sectional view illustrating a process step in accordance with the method of manufacturing the semiconductor memory device according to the present invention.

Next, as shown in FIG. 9, the first insulating film 108 is formed by a thermal oxidation process to a thickness of about 30 nm, followed by a first polysilicon film 109A formed by a CVD process to a thickness of about 300 nm. The first polysilicon film 109A is etched by a thickness of about 300 nm by using an anisotropic dry-etching technique using a mask formed with apertures configured as stripes elongated along a cross section taken along the line II–II' (FIG. 1), whereby the first polysilicon film 109A is formed into stripes elongated across the cross section taken along the line II–II ' (FIG. 1). Next, the second insulating film 110 is formed by a thermal oxidation process to a thickness of about 20 nm, followed by a second polysilicon film with a thickness of about 300 nm and an insulating film with a thickness of about 300 nm, each deposited by a CVD process. Subsequently, the insulating film is masked and etched by a thickness of about 300 nm by an anisotropic dry-etching technique to form the third insulating film 112. Thereafter, the second polysilicon film is further etched by a thickness of about 300 nm by using the third insulating film 112 as a mask, thereby forming the control gate electrode 111.

Figure 10:
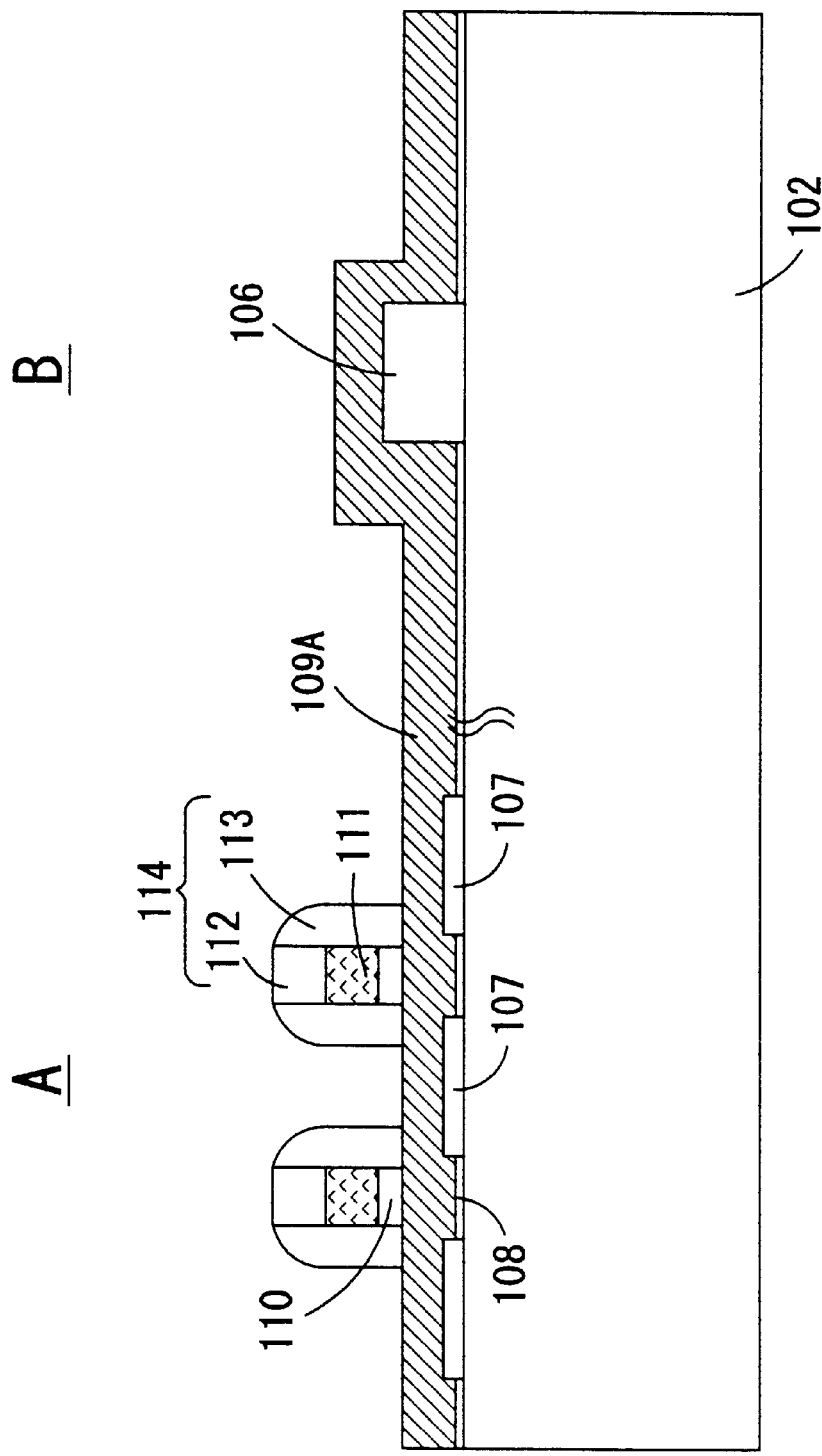
FIG. 10 is a cross-sectional view illustrating a process step in accordance with the method of manufacturing the semiconductor memory device according to the present invention.

Next, as shown in FIG. 10, an insulating film is deposited by a CVD process to a thickness of about 200 nm and then the sidewall insulating films 113 are formed by a known technique. Hereinafter, the combination of the third insulating film 112 and the sidewall insulating films 113 will be termed the first interlayer insulating film 114.

Figure 11:
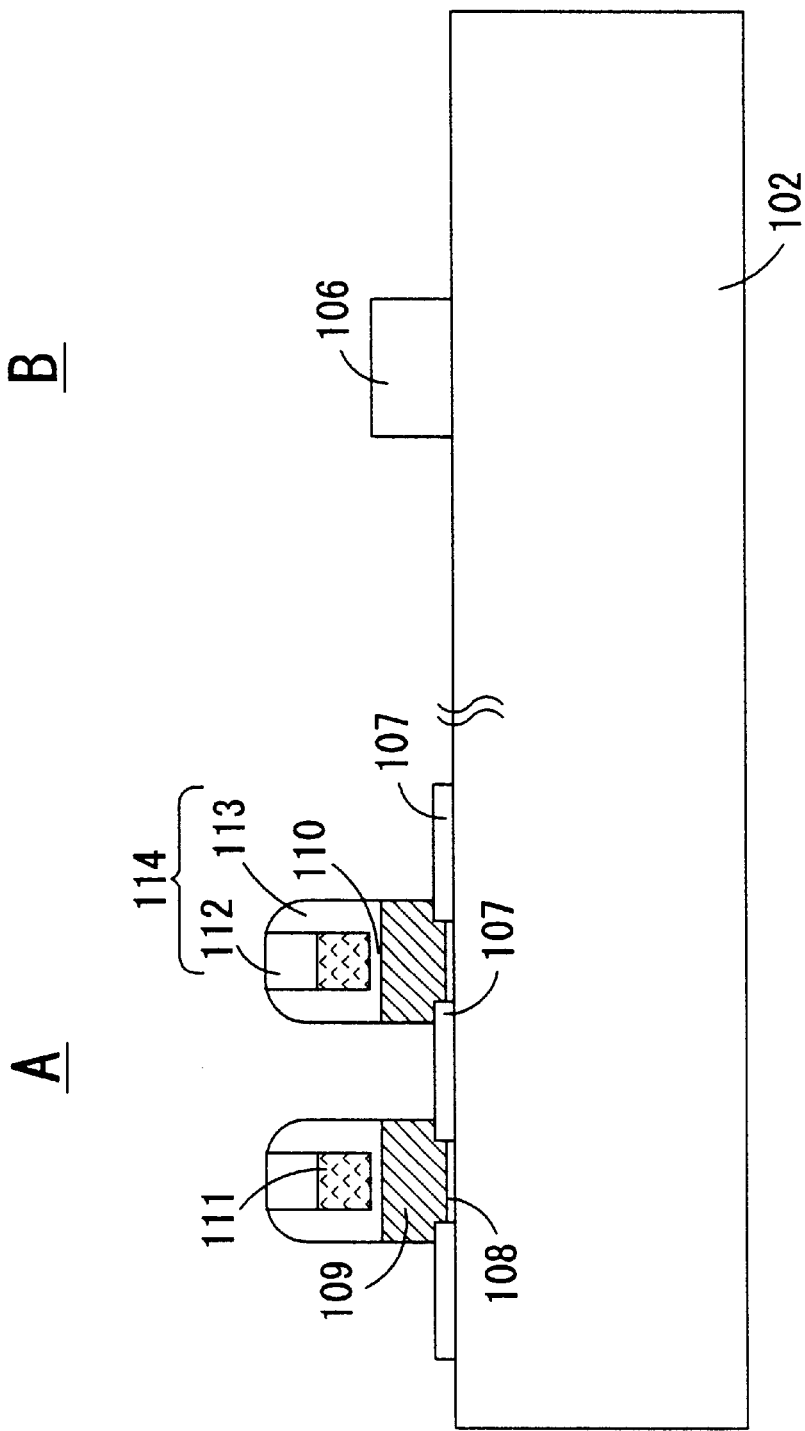
FIG. 11 is a cross-sectional view illustrating a process step in accordance with the method of manufacturing the semiconductor memory device according to the present invention.

Next, as shown in FIG. 11, the first polysilicon film 109A masked with the first interlayer insulating film 114 is etched by a thickness of about 300 nm by using an anisotropic dry-etching technique, thereby forming the floating gate electrode 109.

Figure 12:
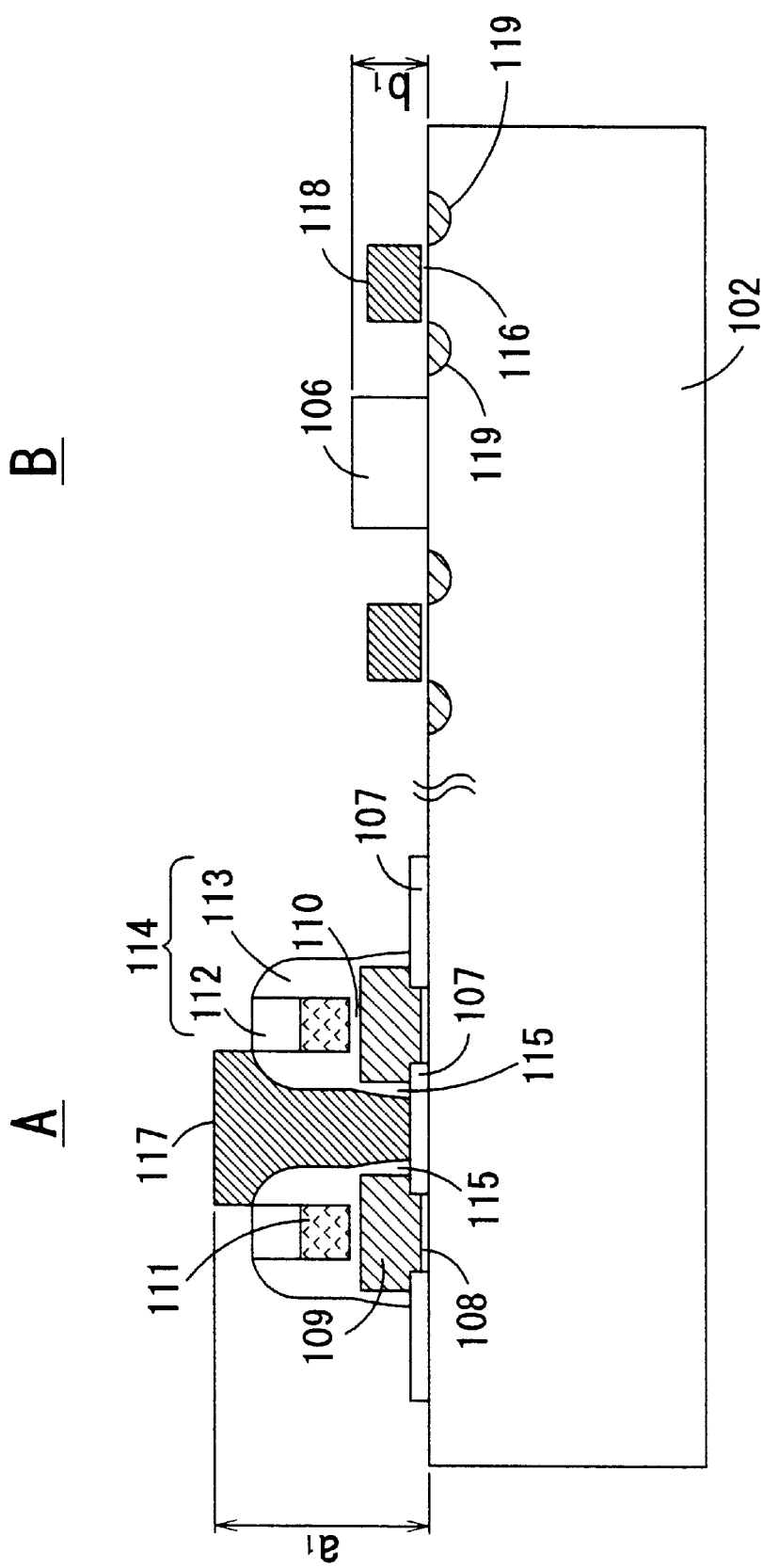
FIG. 12 is a cross-sectional view illustrating a process step in accordance with the method of manufacturing the semiconductor memory device according to the present invention.

Next, as shown in FIG. 12, the tunneling insulating films 115 are formed on portions of the sidewalls of the floating gate electrode 109, while the gate insulating film 116 of the peripheral transistor is formed to a thickness of about 20 nm, both by a thermal oxidation process. Then, a third polysilicon film is deposited by a CVD process to a thickness of about 300 nm. Thereafter, the third polysilicon film is masked and etched by a thickness of about 300 nm by an anisotropic dry-etching technique, thereby forming the erase gate electrode 117 in the memory cell area A and the gate electrode 118 of the peripheral transistor in the peripheral circuit area B. Subsequently, by using a mask formed with an aperture corresponding to the specified source /drain regions of the peripheral transistor, arsenic ions are implanted with an acceleration voltage of 40 keV at a doze of $6 \times 10^{15}/cm^2$, thereby forming the source/drain regions 119 of the peripheral transistor. At this stage, the formation of the memory cells and the peripheral transistor of the semiconductor memory device, which is also shown in FIG. 4, is completed.

Figure 13:
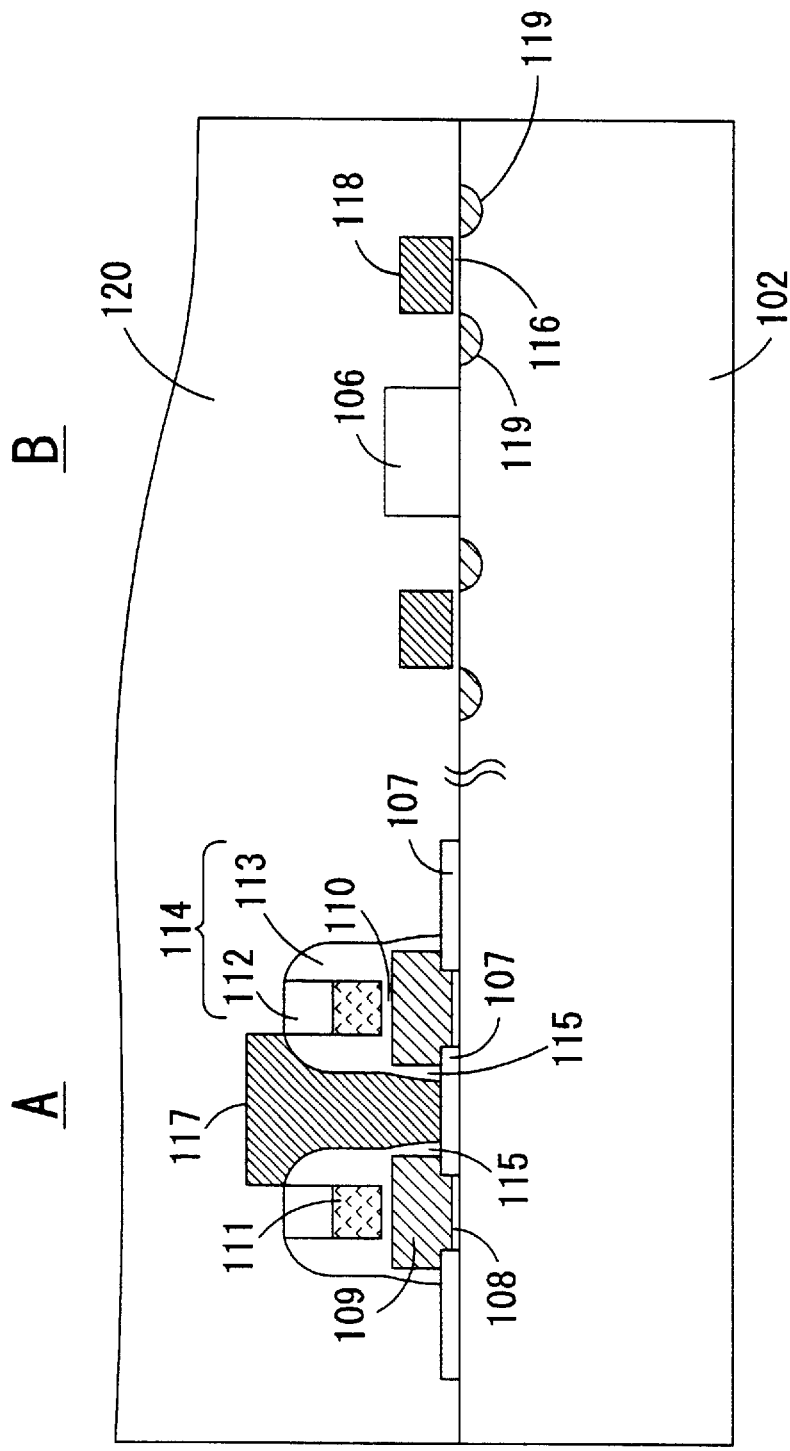
FIG. 13 is a cross-sectional view illustrating a process step in accordance with the method of manufacturing the semiconductor memory device according to the present invention.
Figure 14:
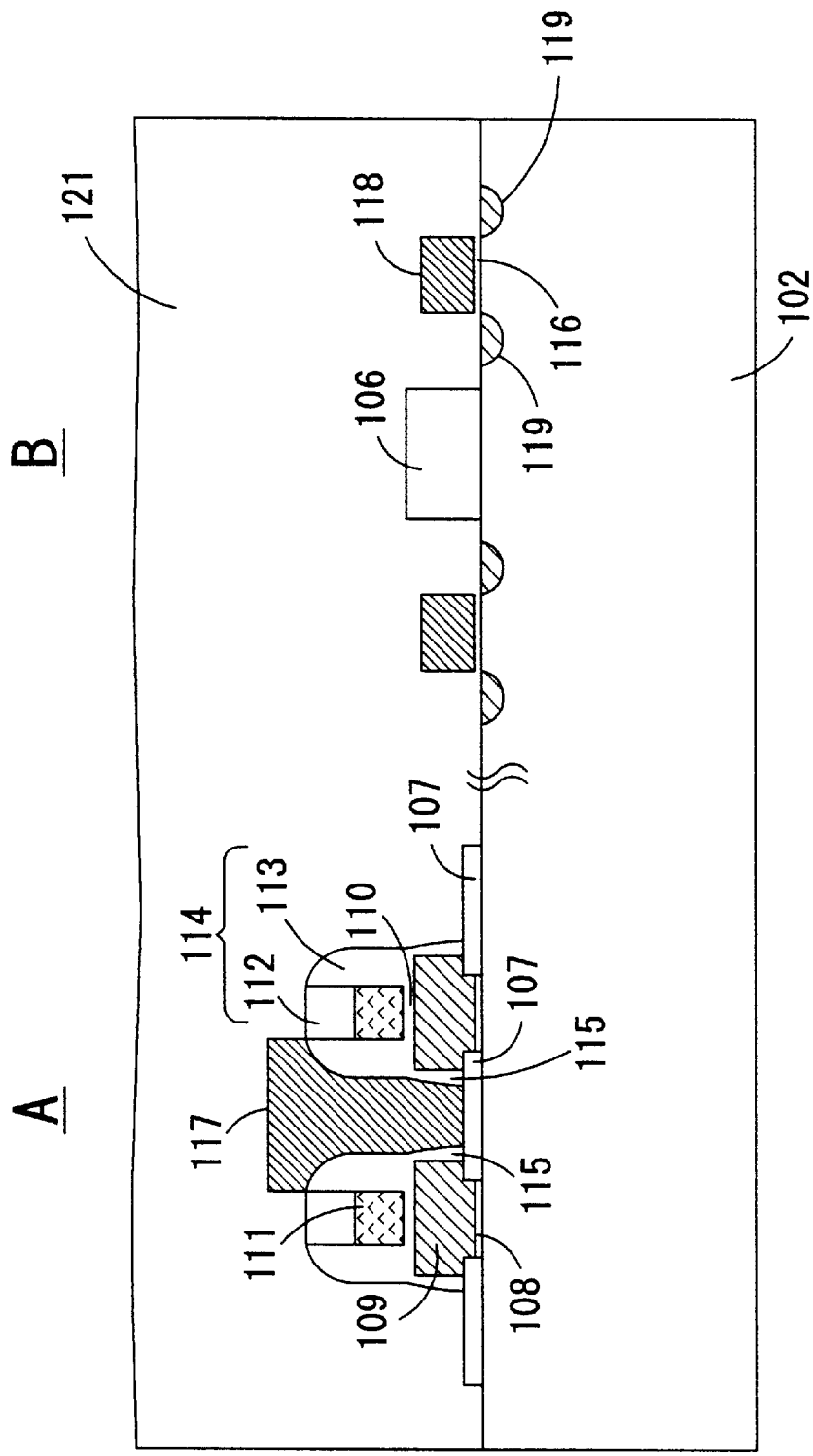
FIG. 14 is a cross-sectional view illustrating a process step in accordance with the method of manufacturing the semiconductor memory device according to the present invention.
Figure 15:
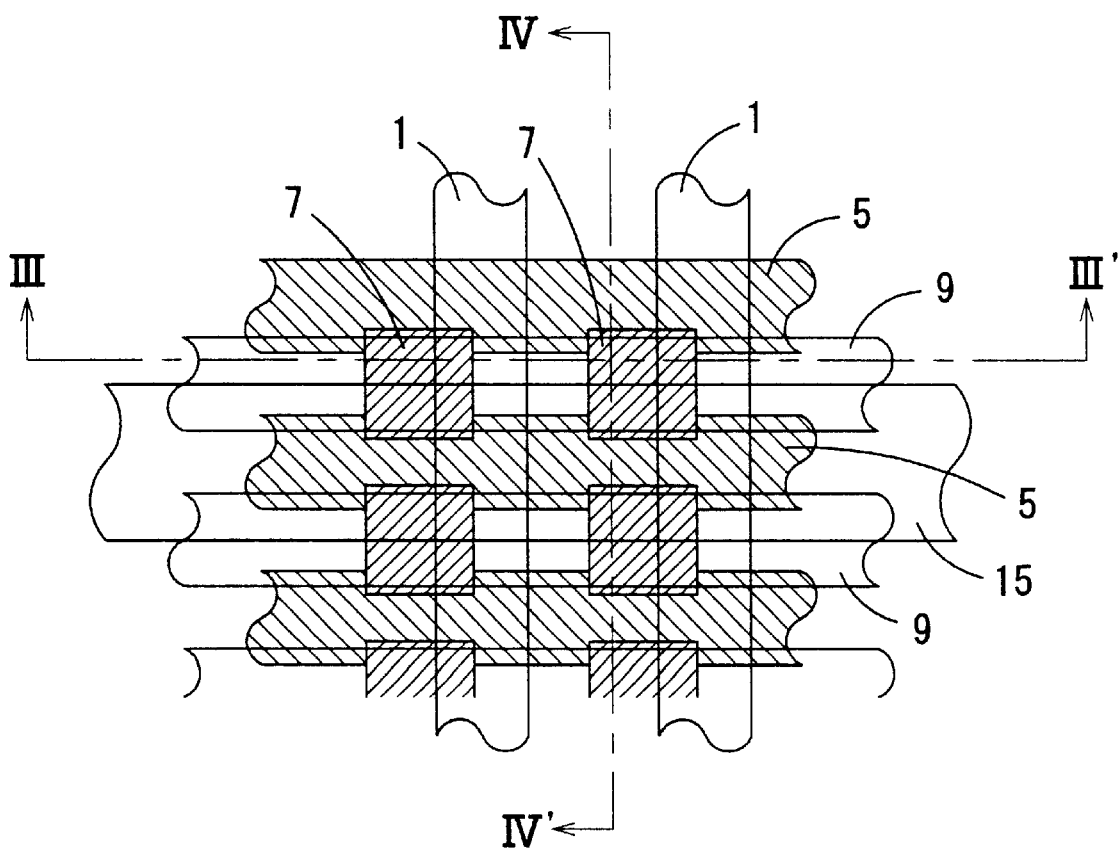
FIG. 15 is a plan view of a memory cell area in a conventional semiconductor memory device.
Figure 16:
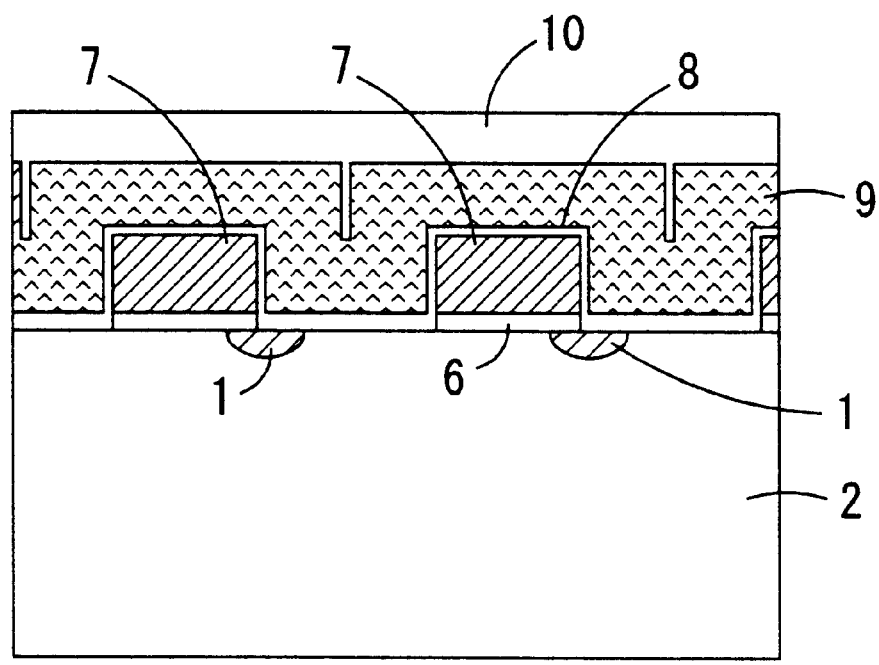
FIG. 16 is a cross-sectional view taken along the line III–III' of FIG. 15.
Figure 17:
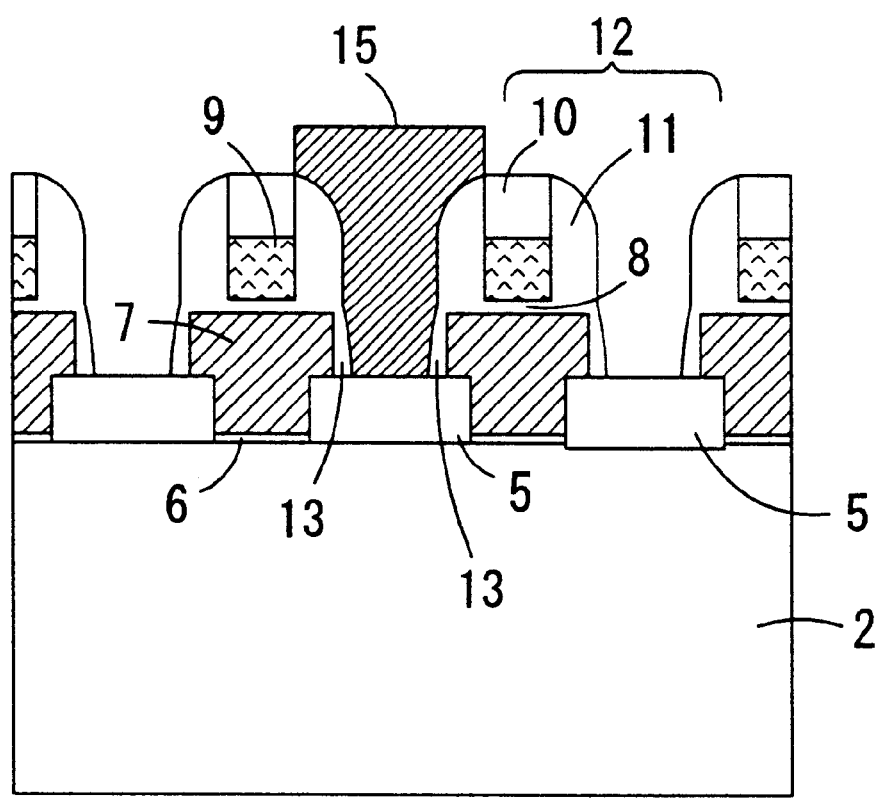
FIG. 17 is a cross-sectional view taken along the line IV–IV' of FIG. 15.
Figure 18:
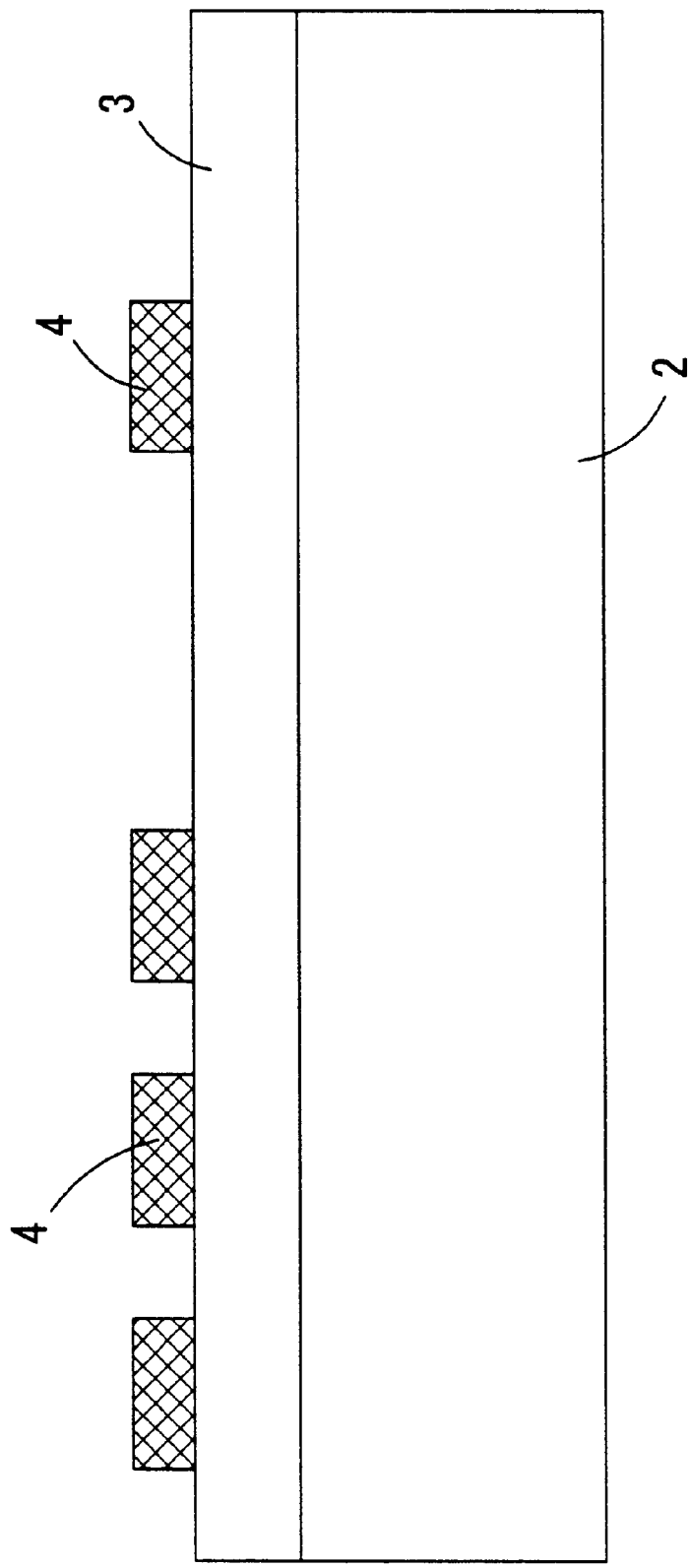
FIG. 18 is a cross-sectional view illustrating a process step in accordance with a method of manufacturing the conventional semiconductor memory device.
Figure 19:
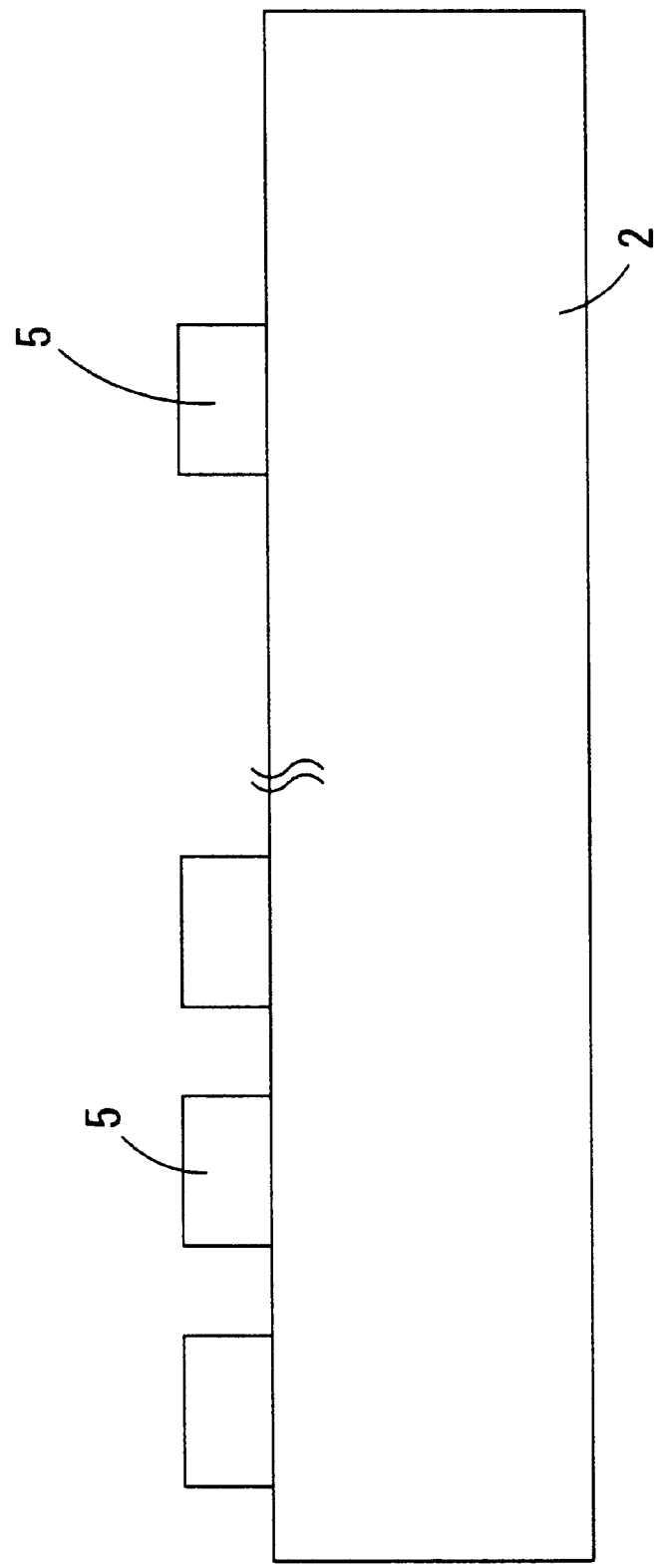
FIG. 19 is a cross-sectional view illustrating a process step in accordance with the method of manufacturing the conventional semiconductor memory device.
Figure 20:
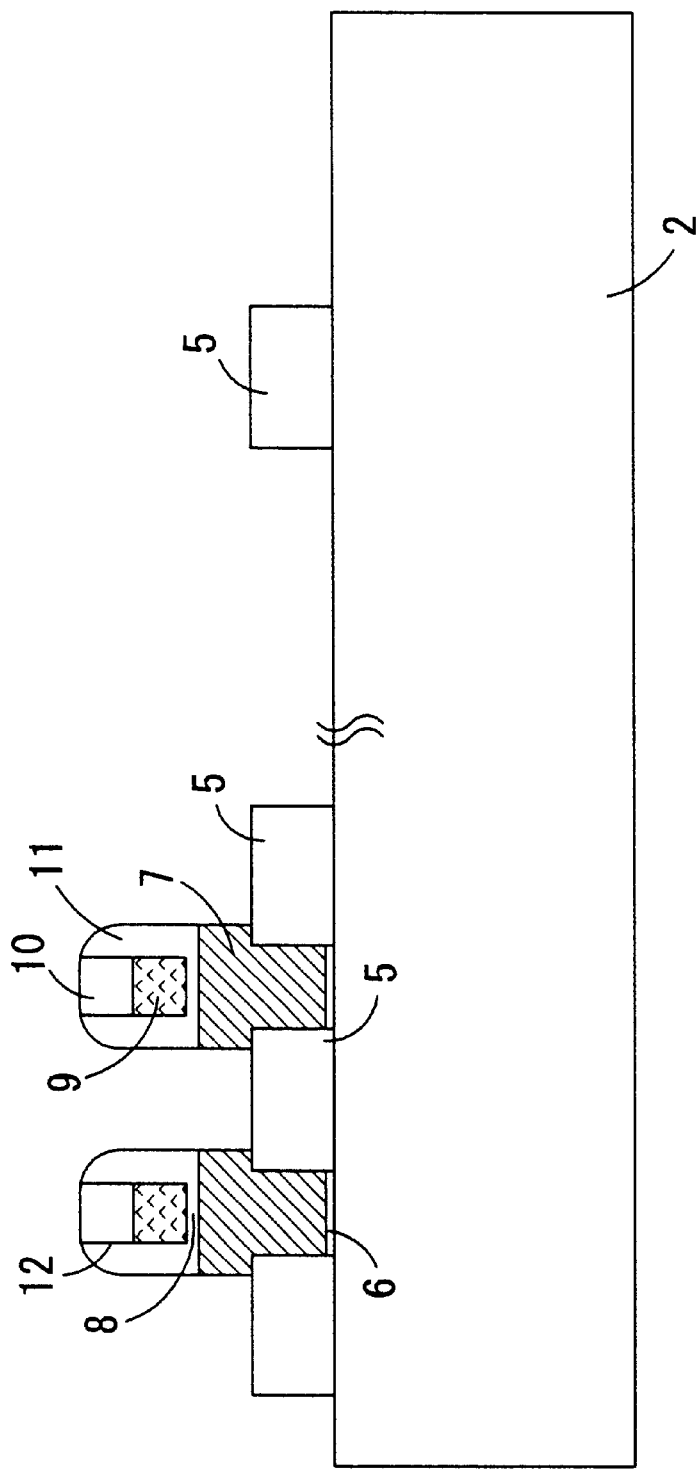
FIG. 20 is a cross-sectional view illustrating a process step in accordance with the method of manufacturing the conventional semiconductor memory device.

In subsequently performing the wiring step, the second interlayer insulating film 120 is deposited by the process of ordinary pressure CVD to a thickness of about 2000 nm, as shown in FIG. 13. Thereafter, annealing treatment is performed in a nitrogen atmosphere at a temperature of 900° C. for about 60 minutes, thereby forming a planarized interlayer insulating film 121 as shown in FIG. 14. It follows therefore that a wiring pattern will be formed on the planarized insulating film 121.

Figure 21:
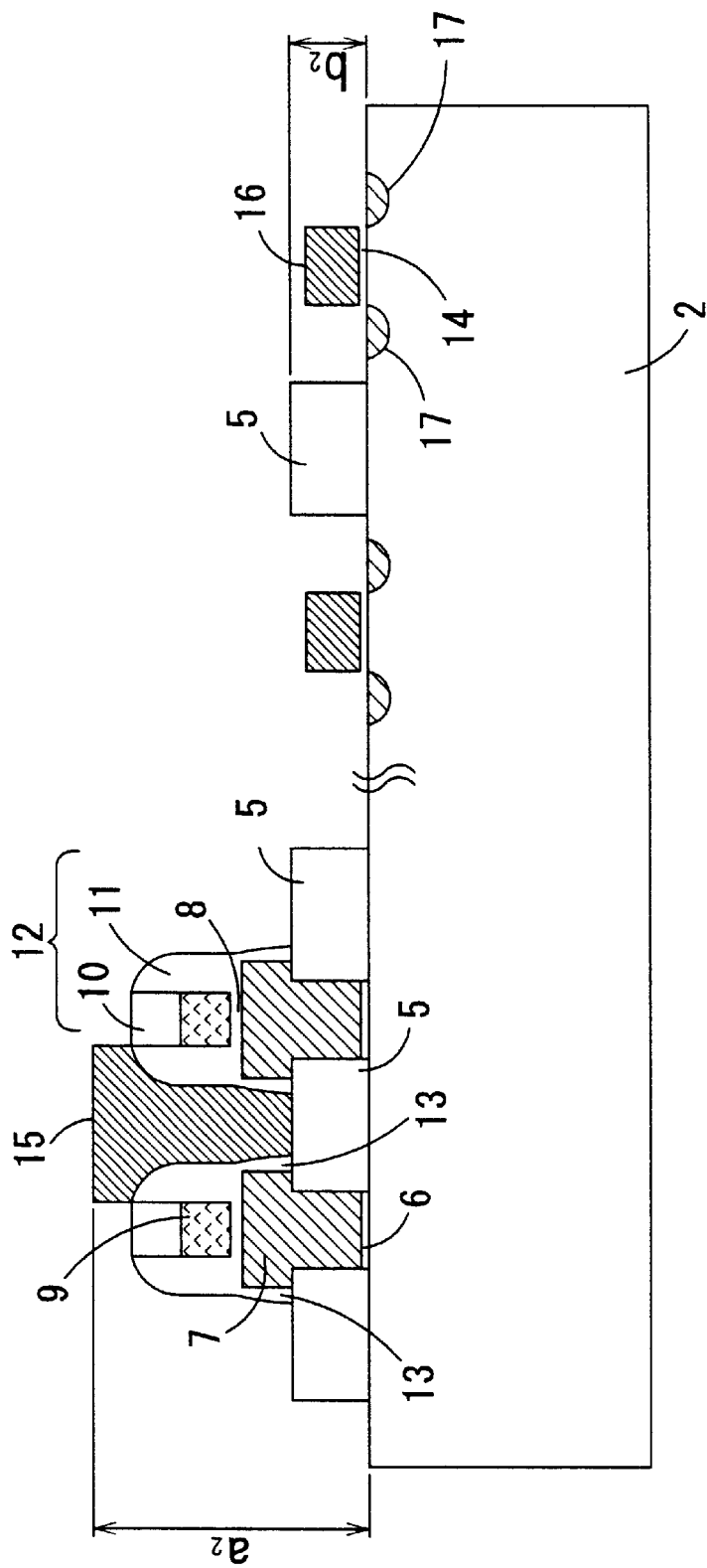
FIG. 21 is a cross-sectional view illustrating a process step in accordance with the method of manufacturing the conventional semiconductor memory device.
Figure 22:
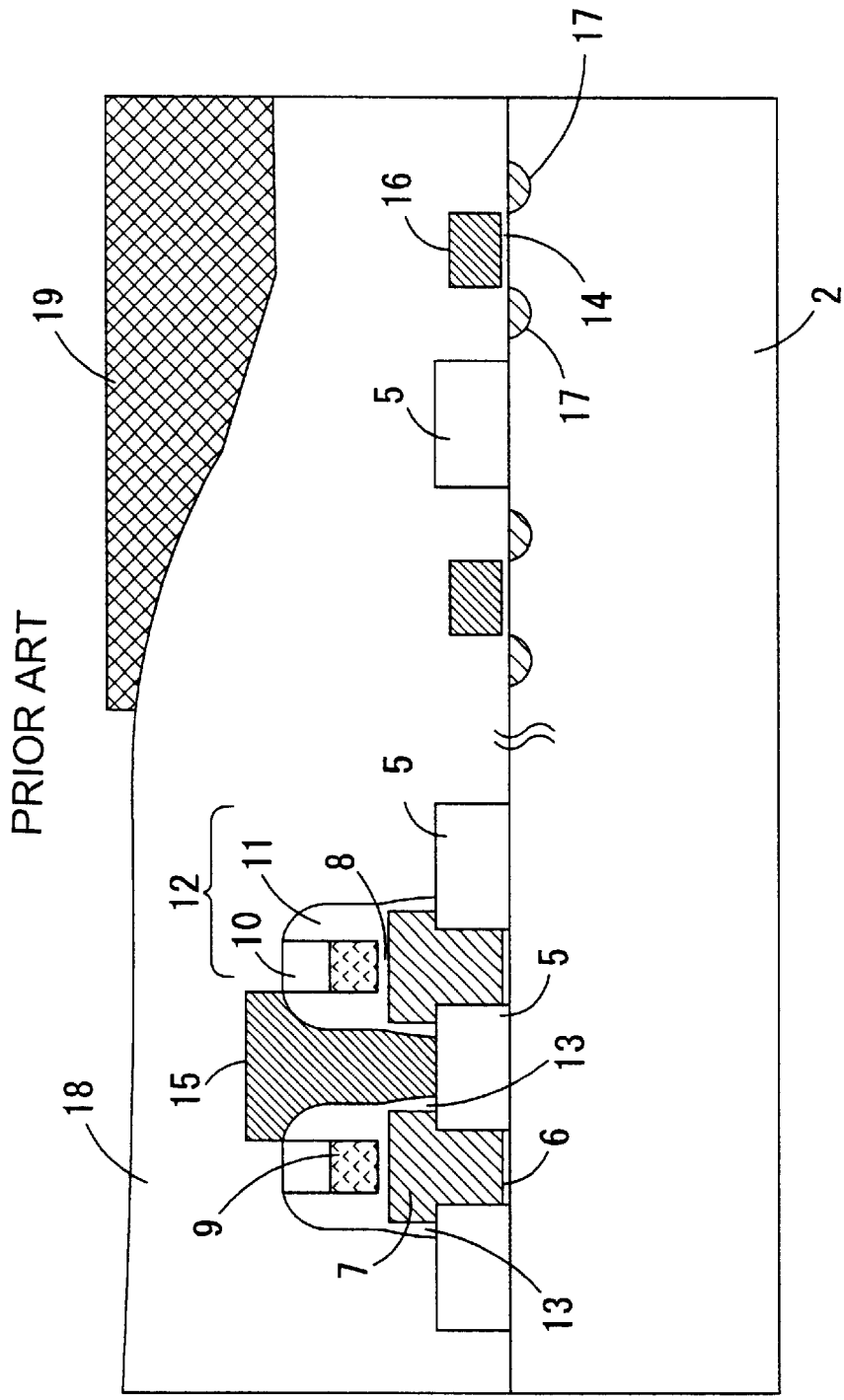
FIG. 22 is a cross-sectional view illustrating a process step in accordance with the method of manufacturing the conventional semiconductor memory device.
Figure 23:
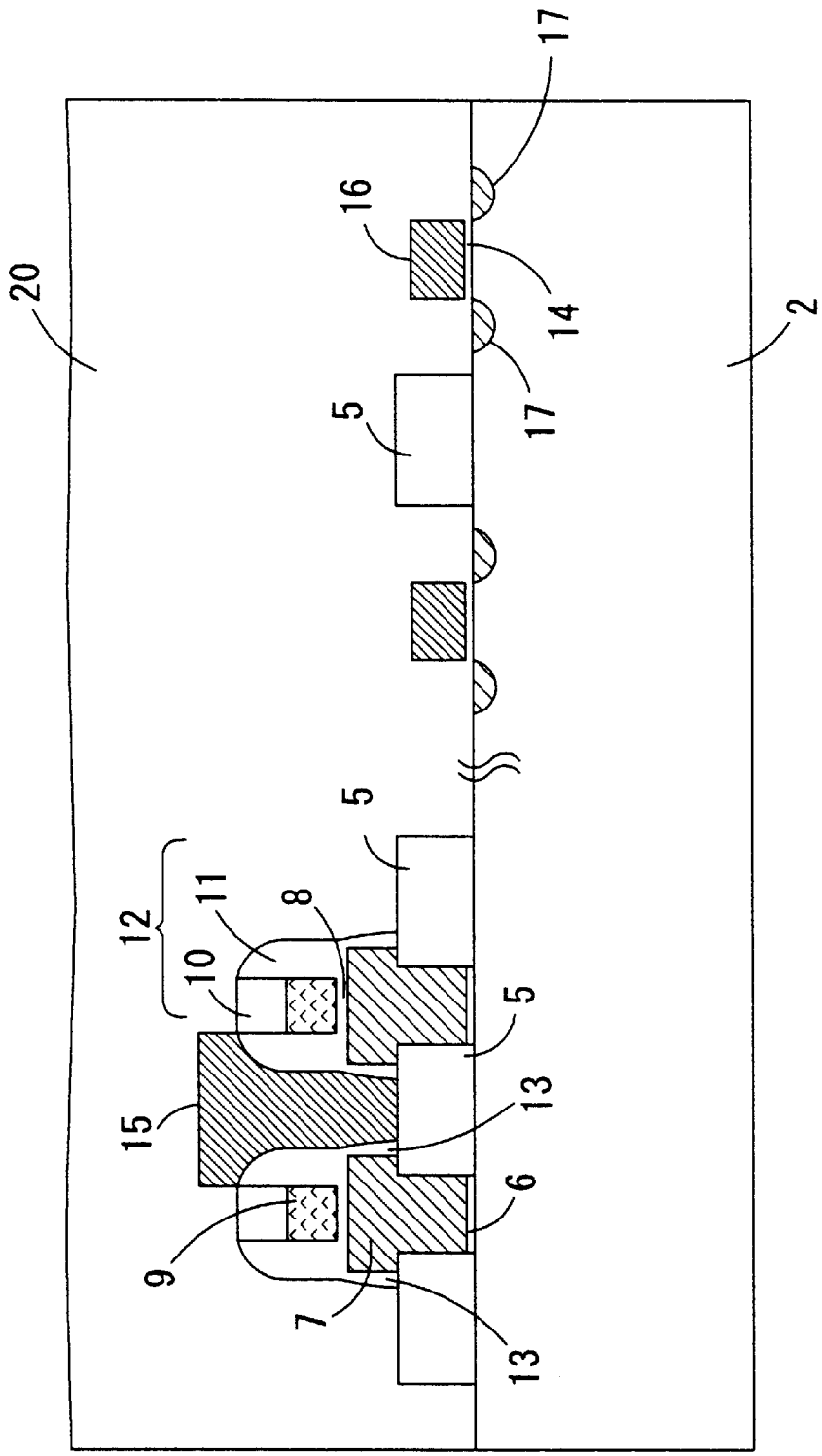
FIG. 23 is a cross-sectional view illustrating a process step in accordance with the method of manufacturing the conventional semiconductor memory device.

Thus, compared with the insulating film 5 for element isolation manufactured by the conventional method, the present embodiment has achieved an approximately 80% reduction from 500 nm to 100 nm in the thickness of the insulating film 107 for element isolation in the memory cell area. On the other hand, an approximately 25% reduction has been achieved in the total film thickness $a_1$ of the memory (FIG. 12) compared with the total film thickness $a_2$ (FIG. 21) obtained by the conventional manufacturing method. By thus forming the insulating films 107 for element isolation in the memory cell area which are thinner than the insulating film 106 for element isolation in the peripheral circuit area, it becomes possible to reduce the total thickness $a_1$ of the memory cell and thereby reduce the height difference ($a_1$–$b_1$) between the memory cell area A and the peripheral circuit area B. As a result, the planarized interlayer insulating film 121 can be formed in the subsequent wiring step without using a step-height reducing mask, which reduces the step height of the underlie on which wiring is to be formed. Hence, there can be omitted the conventional masking step for step height reduction performed to planarize the stepped underlie.

Since the approximately 80% reduction has been achieved in the thickness of the insulating film 107 for element isolation in the memory cell area compared with the insulating film 5 for element isolation manufactured by the conventional method, it is possible to achieve a maximally 75% reduction in the thickness of the floating gate electrode 109 formed between the pair of insulating films 107 for element isolation in the memory cell area. This is because the thickness of the floating gate electrode 109 is largely dependent on the thickness of the underlying insulating film 107 for element isolation since, in order that precise pattern formation is performed therefor, the floating gate electrode 109 needs such a thickness as to allow the first polysilicon film 109A prior to etching to be buried between the insulating films 107 for element isolation. With the insulating film 107 for element isolation which is approximately 20% as thick as the conventional insulating film for element isolation and with the floating gate electrode 109 which is approximately 25% as thick as the conventional floating gate electrode, a maximally 40% reduction has been achieved in the total film thickness $a_1$ of the memory cell compared with the total film thickness $a_2$ of the conventional memory cell. Additionally, a reduction in the step height of the underlie further reduces the film thickness of the control gate electrode 111 and erase gate electrode 117 to be formed thereon and facilitates pattern formation performed therefor.

According to the present embodiment, therefore, the formation of the insulating films 107 for element isolation in the memory cell area which are thinner than the insulating film 106 for element isolation in the peripheral circuit area not only reduces the total film thickness $a_1$ of the memory cell but also the film thickness of the floating gate electrode 109 and the film thickness of the control gate electrode 111 and erase gate electrode 117, thereby further reducing the total film thickness $a_1$ of the memory cell as well as the height difference ($a_1$–$b_1$) between the memory cell area A and the peripheral circuit area B.

In forming the insulating films 107 for element isolation in the memory cell area, the present embodiment has etched only the portion of the insulating film 103 located in the memory cell area A by using the mask pattern 104 to reduce the film thickness and then etched the insulating film 103 by using the mask pattern 105, thereby performing pattern formation for the insulating film 107 simultaneously with pattern formation for the insulating film 106 for element isolation in the peripheral circuit area. However, it is also possible to form the insulating film 106 for element isolation in the peripheral circuit area first by performing etching using the mask pattern 105 and then form the insulating films 107 for element isolation in the memory cell area by performing etching with respect to only the memory cell area A by using the mask pattern 104.

Although the insulating film 106 for element isolation in the peripheral circuit area and the insulating films 107 for element isolation in the memory cell area have been formed by the CVD process, they may also be formed by another formation process such as thermal oxidation or by using another material. The thicknesses of the insulating films 106 and 107 are not limited to a specific value, either, and may be set to two or more values depending on the specifications of the peripheral circuit and the memory cell or on the process conditions.

Although the first and second insulating films 108 and 110 have been formed by the thermal oxidation process, they may also be formed by another formation process such as CVD or by using another material. The thicknesses of the insulating films 108 and 110 are not particularly limited, either. Although the third insulating film 112 has been formed by the CVD process, it may also be formed by another process such as thermal oxidation or by using another material. The thickness of the insulating film 112 is not particularly limited, either.

The thicknesses of the control gate electrode 111 and erase gate electrode 117 are not particularly limited. Besides a polysilicon film, a conductive film such as a refractory polycide film may also be used as a material for composing the foregoing electrodes.

Although the present embodiment has formed the N-channel transistor as the peripheral circuit, it is also possible to form a P-channel transistor instead or both the N-channel transistor and P-channel transistor. Accordingly, the source/drain regions 119 of the peripheral transistor 119 may be either P-type regions or N-type regions. The acceleration voltage and the impurity concentration used to form the source/drain regions 119 are not particularly limited. For example, boron ions may also be implanted with an acceleration voltage of 5 keV at a dose of approximately $1 \times 10^{14}/cm^2$.

As for the thickness of the second interlayer insulating film 120 and the temperature and time for the annealing treatment, they are not particularly limited.

What is claimed is:

1. A semiconductor memory device having a memory cell area and a peripheral circuit area each provided in a semiconductor substrate, said device comprising:
   source and drain regions formed in specified regions of the semiconductor substrate located in said memory cell area;
   an insulating film for element isolation in the peripheral circuit area formed on top of and non-recessed in a main surface of the semiconductor substrate and in a specified region of the semiconductor substrate located in said peripheral circuit area;
   a pair of insulating films for element isolation in the memory cell area formed on top of and non-recessed in a main surface of the semiconductor substrate and in specified regions of the semiconductor substrate located in said memory cell area, each of said pair of insulating films for element isolation in the memory cell area having a thickness smaller than that of said insulating film for element isolation in the peripheral circuit area;

a gate insulating film formed on a portion of said semiconductor substrate isolated by said pair of insulating films for element isolation in the memory cell area;

a floating gate electrode formed in contact with an end portion of at least one of said pair of insulating films for element isolation in the memory cell area in a specified region located between said source and drain regions and over said gate insulating film;

a control gate electrode formed above said floating gate electrode; and an erase gate electrode formed on said one of the insulating films for element isolation in the memory cell area formed with said floating gate electrode, said erase gate electrode being in contact with a sidewall of said floating gate electrode via a tunneling insulating film and with said control gate electrode via an interlayer insulating film.

2. The semiconductor memory device of claim 1, wherein said pair of insulating films is formed through anisotropic etching.

* * * * *